(12) United States Patent
Fujita et al.

(10) Patent No.: US 10,309,379 B2
(45) Date of Patent: Jun. 4, 2019

(54) VIBRATION ENERGY HARVESTER

(71) Applicants: The University of Tokyo, Bunkyo-ku, Tokyo (JP); Saginomiya Seisakusho, Inc., Nakano-ku, Tokyo (JP); Centeral Research Institute of Electric Power Industry, Chiyoda-ku, Tokyo (JP)

(72) Inventors: Hiroyuki Fujita, Tokyo (JP); Hiroyuki Mitsuya, Sayama (JP); Shimpei Ono, Yokosuka (JP)

(73) Assignees: The University of Tokyo, Tokyo (JP); Saginomiya Seisakusho, Inc., Tokyo (JP); Central Research Institute of Electric Power Industry, Tokyo (JP)

( * ) Notice: Subject to any disclaimer, the term of this patent is extended or adjusted under 35 U.S.C. 154(b) by 0 days.

(21) Appl. No.: 15/543,747

(22) PCT Filed: Jan. 14, 2016

(86) PCT No.: PCT/JP2016/051014
§ 371 (c)(1),
(2) Date: Jul. 14, 2017

(87) PCT Pub. No.: WO2016/114361
PCT Pub. Date: Jul. 21, 2016

(65) Prior Publication Data
US 2017/0370352 A1 Dec. 28, 2017

(30) Foreign Application Priority Data
Jan. 16, 2015 (JP) .................................. 2015-006690

(51) Int. Cl.
*H02N 1/00* (2006.01)
*F03G 7/08* (2006.01)
(Continued)

(52) U.S. Cl.
CPC ................. *F03G 7/08* (2013.01); *B81B 5/00* (2013.01); *H01G 7/02* (2013.01); *H01G 11/08* (2013.01); *H01G 11/56* (2013.01); *H02N 1/00* (2013.01)

(58) Field of Classification Search
CPC .............................................. H02N 1/00–1/12
(Continued)

(56) References Cited

U.S. PATENT DOCUMENTS 7,898,096 B1 * 3/2011 Krupenkin ............... H02N 1/08
290/1 R
7,982,371 B1 7/2011 Anand et al.
(Continued)

FOREIGN PATENT DOCUMENTS

CN 101187730 A 5/2008
CN 203377111 U 1/2014
(Continued)

OTHER PUBLICATIONS

Machine Translation, Kim, KR 20120032825 A, Apr. 2012.*
(Continued)

*Primary Examiner* — Thomas Truong
(74) *Attorney, Agent, or Firm* — Crowell & Moring LLP

(57) ABSTRACT

A vibration energy harvester includes: a pair of electrodes provided so as to face opposite each other, with at least one of the pair of electrodes allowed to move; and an ion gel provided between the pair of electrodes, which is formed by using an ionic liquid, wherein: as an external vibration causes the electrode to move along a direction in which a distance between the pair of electrodes changes, power is generated through a change in an area of an electric double layer formed on two sides of an interface of each electrode and the ion gel.

18 Claims, 9 Drawing Sheets

(51) Int. Cl.
  *B81B 5/00*   (2006.01)
  *H01G 7/02*   (2006.01)
  *H01G 11/08*  (2013.01)
  *H01G 11/56*  (2013.01)

(58) Field of Classification Search
  USPC .................................................. 310/300, 309
  See application file for complete search history.

(56) References Cited

U.S. PATENT DOCUMENTS

| | | | |
|---|---|---|---|
| 2002/0039620 A1 | 4/2002 | Shahinpoor et al. | |
| 2005/0023929 A1* | 2/2005 | Fujita | H02N 1/008 |
| | | | 310/309 |
| 2006/0077762 A1* | 4/2006 | Boland | H02N 1/08 |
| | | | 367/170 |
| 2006/0266981 A1 | 11/2006 | Asaka et al. | |
| 2008/0080035 A1 | 4/2008 | Sugahara | |
| 2010/0295415 A1* | 11/2010 | Despesse | H02N 1/08 |
| | | | 310/300 |
| 2012/0161574 A1 | 6/2012 | Hino et al. | |
| 2013/0280579 A1* | 10/2013 | Wright | H01B 1/122 |
| | | | 429/124 |
| 2017/0019034 A1 | 1/2017 | Fujita et al. | |

FOREIGN PATENT DOCUMENTS

| | | |
|---|---|---|
| EP | 1 693 950 A1 | 8/2006 |
| JP | 2005-176428 A | 6/2005 |
| JP | 2011-36089 A | 2/2011 |
| JP | 2011-507479 A | 3/2011 |
| KR | 20120032825 A * | 4/2012 |
| WO | WO 2015/129442 A1 | 9/2015 |

OTHER PUBLICATIONS

International Search Report (PCT/ISA/210) issued in PCT Application No. PCT/JP2016/051014 dated Apr. 19, 2016 with English-language translation (four (4) pages).

Japanese-language Written Opinion (PCT/ISA/237) issued in PCT Application No. PCT/JP2016/051014 dated Apr. 19, 2016 (four (4) pages).

Extended European Search Report issued in counterpart European Application No. 16737432.1 dated Jul. 16, 2018 (six pages).

* cited by examiner

FIG.1
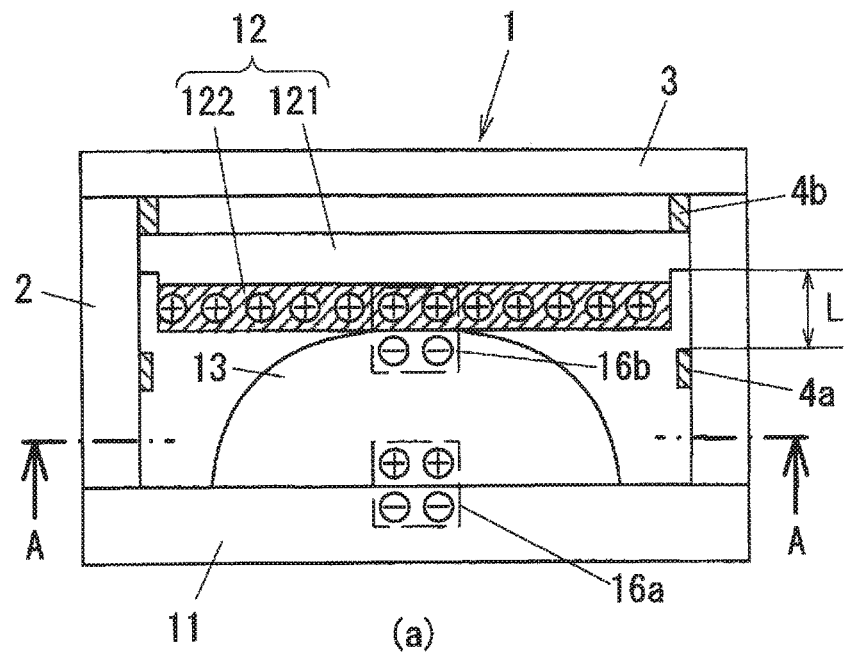
(a)
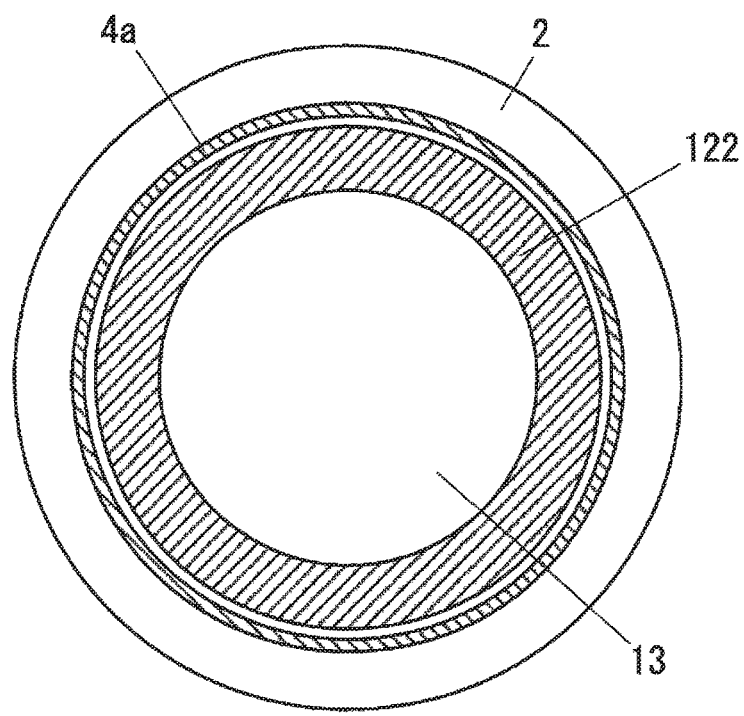
(b)

FIG.9
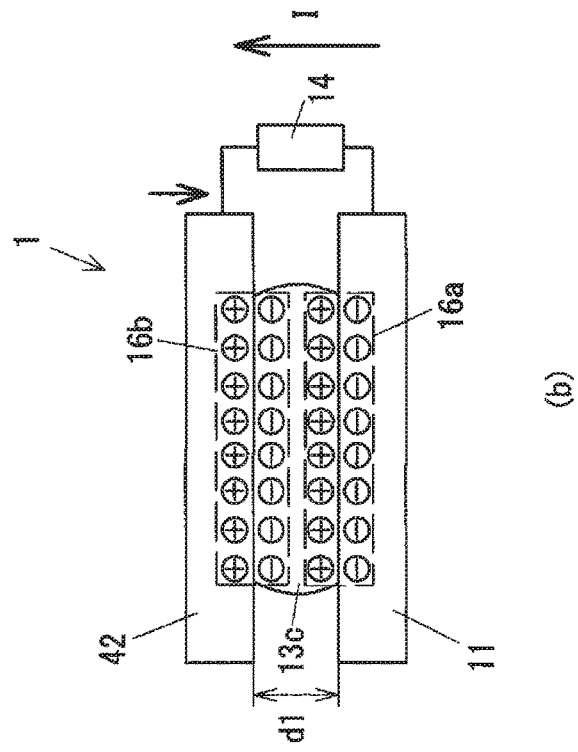
(b)
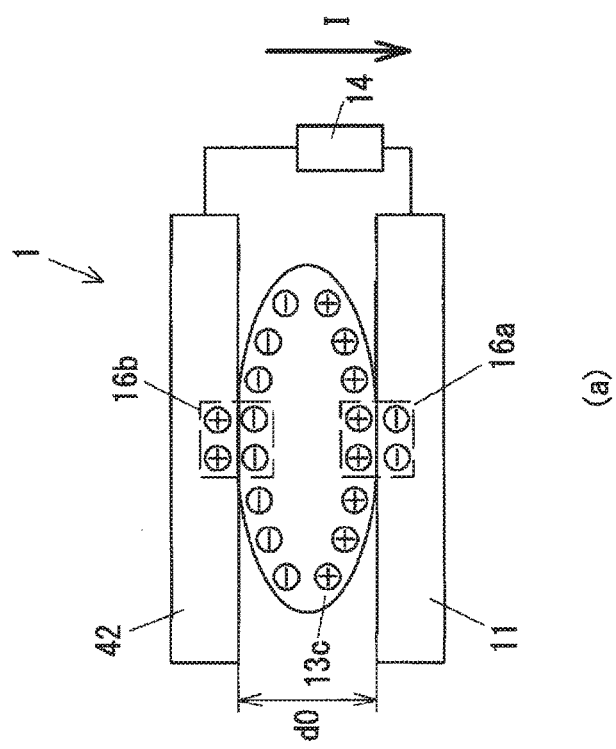
(a)

VIBRATION ENERGY HARVESTER

TECHNICAL FIELD

The present invention relates to a vibration energy harvester that includes an ion gel using ionic liquids.

BACKGROUND ART

It is effective conventionally to use electret as a device that generates electric power by vibrating in the environment (energy harvesters), and many research and development have been performed in this field. As vibration-powered electricity generating devices, primarily used as power sources for various types of wireless standalone sensors and as power sources for wireless communication devices engaged in exchange of signals by such wireless standalone sensors, they need to be compact and capable of generating significant amounts of power (in a μW through mW range). A vibration energy harvester disclosed in PTL1, for instance, generates power by inducing a vibrating electrode to vibrate relative to an electrode with an electret formed thereat.

CITATION LIST

Patent Literature

PTL1: Japanese Laid Open Patent Publication No. 2011-36089

SUMMARY OF INVENTION

Technical Problem

There is a challenging issue to be addressed in order to achieve both a smaller device size and a greater power generation output in the vibration energy harvester described above, in that the electrodes are separated from each other by a distance in a μm-order, and the amount of power it can generate will be limited even in conjunction with an electret.

Solution to Problem

According to the first aspect of the present invention, a vibration energy harvester, comprises: a pair of electrodes provided so as to face opposite each other, with at least one of the pair of electrodes allowed to move; and an ion gel provided between the pair of electrodes, which is formed by using an ionic liquid, wherein: as an external vibration causes the electrode to move along a direction in which a distance between the pair of electrodes changes, power is generated through a change in an area of an electric double layer formed on two sides of an interface of each electrode and the ion gel.

According to the second aspect of the present invention, in the vibration energy harvester according to the first aspect, it is preferred that one of the pair of electrodes facing opposite each other is an electret electrode; and a surface potential at the electret electrode is set so that when the ion gel comes in contact with the electret electrode, a voltage at the electric double layer is within a range defined by a potential window of the ion gel.

According to the third aspect of the present invention, in the vibration energy harvester according to the first aspect, it is preferred that the electric double layer is formed through an electrokinetic phenomenon occurring over a contact region where each of the pair of electrodes and the ion gel are in contact with each other.

According to the fourth aspect of the present invention, in the vibration energy harvester according to the first aspect, it is preferred that the ion gel is formed by using the ionic liquid, which contains an unsaturated bond.

According to the fifth aspect of the present invention, in the vibration energy harvester according to the first aspect, it is preferred that the ion gel is formed by using a polymer containing an unsaturated bond and the ionic liquid.

According to the sixth aspect of the present invention, in the vibration energy harvester according to the first aspect, it is preferred that the ion gel is formed by using the ionic liquid which has been made to a solid state.

According to the seventh aspect of the present invention, in the vibration energy harvester according to any one of the fourth through sixth aspects, it is preferred that an anion layer or a cation layer is formed and sustained on a side of the ion gel that comes into contact with at least one of the pair of electrodes; and the electric double layer is formed in a contact region where at least one of the pair of electrodes comes into contact with the anion layer or the cation layer in the ion gel.

According to the eighth aspect of the present invention, in the vibration energy harvester according to the seventh aspect, it is preferred that the pair of electrodes are a fixed electrode and a movable electrode that is allowed to move along a direction in which a distance thereof from the fixed electrode changes, the movable electrode includes a front-side electrode provided on a front surface side of the movable electrode and a back-side electrode provided on a back surface side of the movable electrode; the fixed electrode includes a first electrode provided so as to face opposite the front-side electrode and a second electrode provided so as to face opposite the back-side electrode; and the ion gel is provided between the first electrode and the front-side electrode and between the second electrode and the back-side electrode.

Advantageous Effects of Invention

According to the present invention, further miniaturization of vibration energy harvesters and an improvement of power generation can both be achieved.

BRIEF DESCRIPTION OF DRAWINGS

FIG. 1 shows sectional views of the vibration energy harvester achieved in a first embodiment of the present invention

FIG. 9 shows illustrations of a fourth embodiment

DESCRIPTION OF EMBODIMENTS

—First Embodiment—

Figure 2:
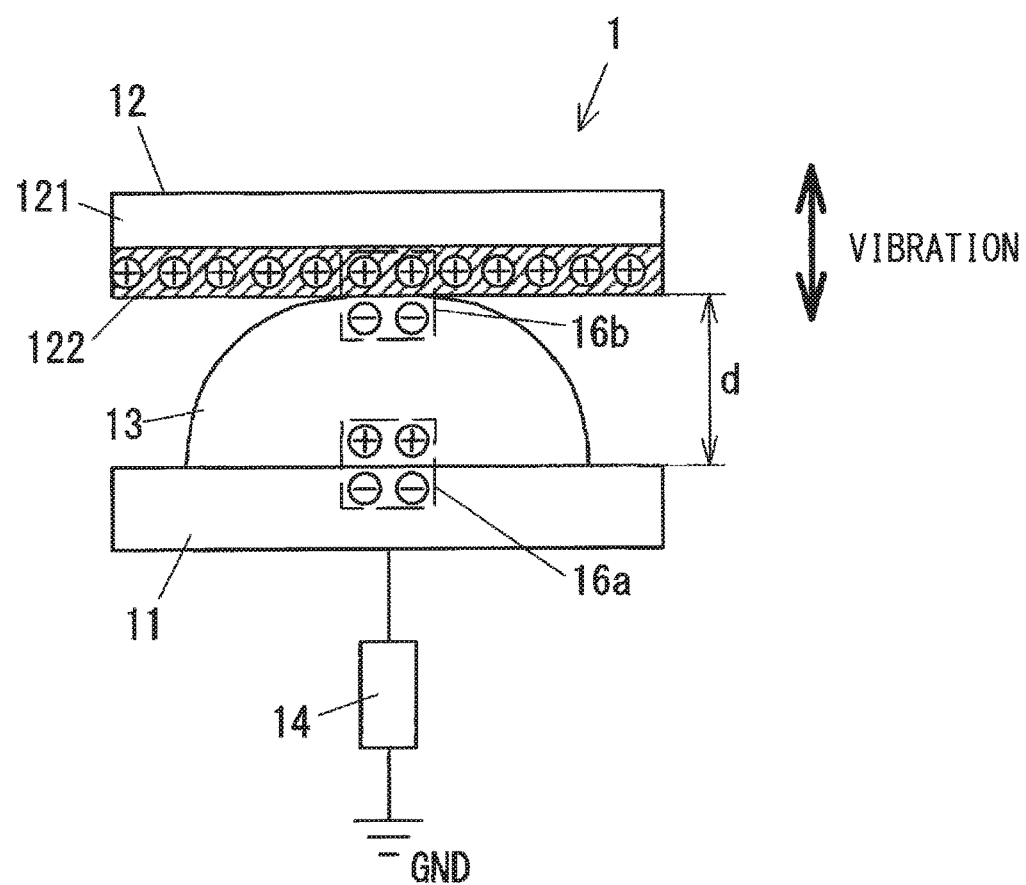
FIG. 2 shows a schematic illustration of an essential part of the vibration energy harvester shown in FIG. 1

FIG. 1 illustrates the first embodiment of the vibration energy harvester according to the present invention. FIG.

1(*a*) shows a vibration energy harvester 1 in a sectional view, whereas FIG. 1(*b*) provides a sectional view taken along A-A in FIG. 1(*a*). The vibration energy harvester 1 includes a fixed electrode 11, a movable substrate 12 and an ion gel 13. The ion gel 13, which is formed by using ionic liquids, is provided in the space between the fixed electrode 11 and the movable substrate 12. The fixed electrode 11 also functions as a bottom plate of a container formed for the vibration energy harvester 1. The container is made up with the fixed electrode 11, and a cylindrical portion 2 and a top plate 3, both constituted of an insulating material.

The movable substrate 12 and the ion gel 13 mentioned earlier are housed inside the container. The movable substrate 12 is provided so as to be allowed to move along the up/down direction in FIG. 1(*a*), and its range of up/down movement L is limited by ring-shaped stoppers 4a and 4b. It is to be noted that since the downward movement range of the movable substrate 12 can be regulated with the elasticity of the ion gel 13, the lower stopper 4a does not need to be provided. Since any gas present inside the container will hinder the movement of the movable substrate 12, it is desirable to sustain a vacuum within the container. The disk-shaped movable substrate 12 includes a support substrate 121 and an electret 122 provided at the lower surface (i.e., the surface facing opposite the fixed electrode 11) of the support substrate 121.

The electret 122 is formed by fixing a unipolar charge within a dielectric material. For instance, a dielectric film constituted of polypropylene (PP) or polytetrafluoroethylene (PTFE) can be made electret by charging it with a positive charge (or a negative charge) through, for instance, corona discharge. Namely, the movable substrate 12 with the electret 122 formed thereat is able to function as a movable electrode.

It is desirable that the surface of the fixed electrode 11 that comes into contact with the ion gel 13 be constituted of, for instance, gold (Au). It is also desirable that the inner surface of the cylindrical portion and the outer circumferential surface of the support substrate 121, which slide against each other as the movable substrate 12 moves up/down, be constituted of a material with a low coefficient of friction (e.g., PTFE).

The ion gel 13 provided between the movable substrate 12 and the fixed electrode 11 is in contact with the electret 122 and the fixed electrode 11. The electret 122 in the present embodiment is positively charged and thus, negative ions in the ion gel 13 move toward the electret at the contact surface where the ion gel 13 comes into contact with the electret 122. In turn, a corresponding number of positive ions in the ion gel 13 move toward the fixed electrode 11. As a result, an electric double layer 16b is formed on the two sides of the interface of the electret 122 and the ion gel 13, and an electric double layer 16a is also formed on the two sides of the interface of the fixed electrode 11 and the ion gel 13 on the position of the side opposite from the electric double layer 16b.

It is to be noted that various kind of substance can be used as the ion gel 13. For instance, a mixed liquid may be prepared by mixing a monomer, a solvent, a polymerization agent and the like into an ionic liquid, and a semi-spherical liquid mass having a diameter of approximately 2.5 mm may be formed by dripping this mixed liquid with a syringe or the like. After evaporating the solvent by heating the liquid mass thus formed in an oven or the like, it may be cured through ultraviolet irradiation or the like so as to gel the ionic liquid. The gelled ionic liquid thus prepared can be used as the ion gel 13. Any other substance may be used as the ion gel 13 as long as it is prepared by using an ionic liquid.

FIG. 2 is a schematic illustration of an essential part of the vibration energy harvester 1. A load 14 is connected to the fixed electrode 11. The potential at the movable substrate 12 is higher than that at the fixed electrode 11 by an extent corresponding to the voltage from electret (the surface potential of the electret 122). The ion gel 13 is a type of gel formed by mixing a polymer into an organic liquid exclusively constituted of positive ions and negative ions. While the ion gel 13 assures good conductivity, it assumes a wide potential window and thus achieves a high level of electric stability. The term "potential window" is used to refer to a potential area where substantially no electric current flows within an electrolytic solution.

The voltage (surface potential) at the electret 122 described above is set so that when the ion gel 13 comes into contact with the electret 122, the voltage applied to the electric double layers 16a and 16b in the ion gel 13 will be within the range of the potential window of the ion gel 13. It is to be noted that in order to ensure that the vibration energy harvester achieves sufficient power generating capability, the voltage at the electret 122 should be set to the highest possible value within the range defined by the potential window. In the following description, the voltage applied to the ion gel 13 via the electric 122 will be referred to as a bias voltage.

The negative ions in the ion gel 13 present between the electret 122 and the fixed electrode 11 are attracted toward the electret 122 due to the electric field formed by the electret 122. As a result, the electric double layer 16b is formed on the two sides of the interface of the electret 122 and the ion gel 13, as described earlier. In addition, in the region where the fixed electrode 11 and the ion gel 13 are in contact with each other, positive ions in the ion gel 13 move toward the fixed electrode 11 in a quantity corresponding to that of the negative ions forming the electric double layer 16b, and these positive ions and a negative charge electrostatically induced on the side where the fixed electrode 11 is present together form the electric double layer 16a. The thickness of such an electric double layer, determined by factors such as the type of ion gel 13, is normally approximately 1 [nm]. In addition, it is known that the electrostatic capacitance occurring as an AC voltage is applied to an electric double layer is normally approximately 10 [$\mu$F/cm$^2$] to 0.2 [$\mu$F/cm$^2$] over a test range of 0.1 Hz to 1 MHz.

Figure 3:
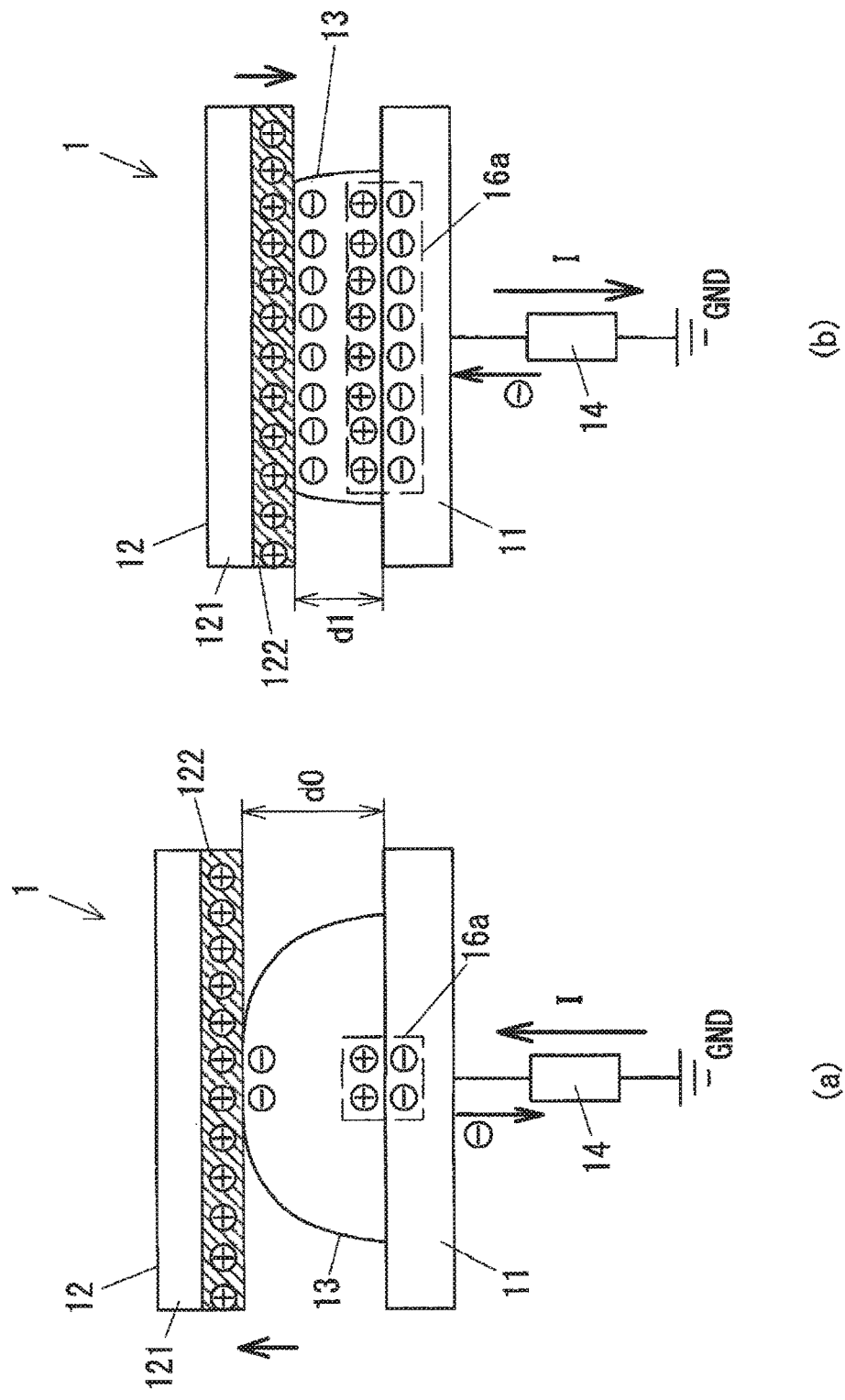
FIG. 3 shows illustrations of the power generating operation executed in the first embodiment

As FIG. 2 shows, the movable substrate 12 in the vibration energy harvester 1 is structured so that it is allowed to move in a direction along which a distance d between the fixed electrode 11 and the movable substrate 12 is altered. As an external vibration (hereafter referred to as a disturbance) causes the container in the vibration energy harvester 1 to vibrate (more specifically, vibrate along the axial direction), the movable substrate 12 vibrates relative to the fixed electrode 11 in the up/down direction in the figure. The movable substrate 12 may move up/down over the range in which the distance d changes from d0 through d1 as illustrated in FIG. 3, in reference to which an explanation will be provided later. This range of movement may be set in correspondence to the positions taken for the stoppers 4a and 4b shown in FIG. 1, or the elasticity, the shape or the like of the ion gel 13.

Next, the operation of the vibration energy harvester 1 will be described. While a conventional vibration energy harvester generates power through a change in the electrostatic capacitance between electrodes (e.g., between a metal electrode and an electret electrode), the vibration energy harvester 1 in the present embodiment is characterized in that it generates power through a change in the contact area where contact with the ion gel 13 occurs (i.e., a change in the electric double layer area), induced by vibration of the movable substrate 12.

While the electrostatic capacitance per unit area of an electric double layer changes in correspondence to the bias voltage mentioned earlier or the vibration frequency, the electrostatic capacitance per 1 cm² is approximately 10 [$\mu F/cm^2$] when the vibration frequency is 0.1 Hz provided that the bias voltage applied to the ion gel 13 is within the potential window range. Namely, if the electric double layers 16a and 16b each have an area of 1 [$cm^2$], the electricity generated where the electric double layers 16a and 16b are present will be approximately 10 [$\mu F$]=1×10⁻⁵ [F]. Under such circumstances, assuming that the voltage applied to the electric double layers 16a and 16b is 1 [V], the quantity of charge (charge amount) is 1×10⁻⁵ [C].

In contrast, in the conventional vibration energy harvester with an electret electrode, the electrostatic capacitance C ($C=\varepsilon_0 \times (area)/(distance)$) between the electret electrode and the metal electrode is calculated to be 8.85×10⁻¹² [F] to 8.85×10⁻¹¹ [F] assuming that the electret electrode and the metal electrode face opposite each other over 1 [$cm^2$] area and are set apart from each other by approximately 10 to 100 [$\mu m$]. In this case, if the voltage applied to the electret electrode is 200 [V], the charge amount will be 1.77×10⁻⁹ to 1.77×10⁻¹⁰ [C], provided that the vacuum dielectric constant $\in 0$ is approximately equal to 8.85×10⁻¹² [F/m].

In the present embodiment described above, the charge at the electrode is greatly increased to a level 10,000 to 100,000 times that achieved at the vibration energy harvester with a conventional electret, while the voltage applied to the electric double layers is kept down as low as 1 [V]. This is made possible by the use of electric double layers with a layer thickness (hereafter indicated as "de") in an order of nm. The structure achieved in the present embodiment, through which power is generated as the areas of the electric double layers achieving a large electrostatic capacitance value change, makes it possible to generate power in a quantity of a completely different order of magnitude compared to that achieved in the conventional vibration energy harvester, as will be described later.

In addition, instead of disposing an ionic liquid as it is, the ion gel 13 formed by using an ionic liquid, is provided between the movable substrate 12 and the fixed electrode 11. This means that as the movable substrate 12 vibrates, the contact area of the movable substrate 12 and the ion gel 13 and the contact area of the fixed electrode 11 and the ion gel 13 can be altered with reliability without being readily affected by the wettability attributable to the ionic liquid at the movable substrate 12 and the fixed electrode 11, unlike in a vibration energy harvester that includes an ionic liquid as it is. Furthermore, in a vibration energy harvester with an ionic liquid, the ionic liquid may be attracted toward and held at the movable substrate 12 or the fixed electrode 11 due to electrostatic attraction (ESA). Under such circumstances, even as the distance between the movable substrate 12 and the fixed electrode 11 increases due to vibration of the movable substrate 12, the contact areas of these electrodes and the ion gel 13 may not change as expected. In contrast, the present embodiment is free of the problem described above, since any electrostatic attraction can be overcome through the elasticity (resilience) of the ion gel 13, and as a result, the contact area of the movable substrate 12 and the ion gel 13 and the contact area of the fixed electrode 11 and the ion gel 13 can be altered as desired.

It is to be noted that the region where the ion gel 13 is present and an unoccupied spatial region (a vacuum in the present embodiment) take up the gap between the fixed electrode 11 and the movable substrate 12, as indicated in FIG. 2, and an electrostatic capacitance is also formed in the region where the ion gel 13 is not present. For instance, the electrostatic capacitance C, generated when a pair of electrodes (each having an areal size of 1 [$cm^2$]) face opposite each other over a distance d=1 [mm] with no ion gel 13 present between them, will be calculated as; $C=\varepsilon_0 \times 1 \times 10^{-4}$ [$m^2$]/1×10⁻³ [m]≈8.85×10⁻¹³ [F].

As explained earlier, the values of the electrostatic capacitance generated in the regions where the electric double layers 16a and 16b, each having an areal size of 1 [$cm^2$], are present is approximately 10 [$\mu F$]=1×10⁻⁵ [F]. This means that the electrostatic capacitance manifesting in a region where no ion gel 13 is present is extremely small, at approximately ¹⁄₁₀⁷ of the electrostatic capacitance at the electric double layers 16a and 16b.

Accordingly, the following description of the operation executed at the vibration energy harvester 1 will be given by disregarding the electrostatic capacitance in the region where no ion gel 13 is present and assuming that electric double layer capacitors are connected in series. In other words, power is generated substantially through a change induced in the electrostatic capacitance as the area of the electric double layers 16a and 16b change at the vibration energy harvester 1.

FIG. 3 schematically illustrates the operation executed in the vibration energy harvester 1. FIG. 3(*a*) shows the distance d at its greatest, i.e., d=d0 (a state similar to that shown in FIG. 2), whereas FIG. 3(*b*) shows the distance d at its smallest, i.e., d=d1. S0 represents both the area of the electric double layer 16a formed as the electret 122 and the ion gel 13 contact each other and the area of the corresponding electric double layer 16b formed at the contact surface where the fixed electrode 11 and the ion gel 13 are in contact with each other in FIG. 3(*a*). In addition, S1 represents the area of the electric double layers 16a and 16b in FIG. 3(*b*). In FIG. 3(*b*) the electret 122 and the ion gel 13 are in contact over a greater area as the ion gel 13 is compressed by the movable substrate 12 and the fixed electrode 11 along the up/down direction. Thus, the electric double layers 16a and 16b take on a greater area compared to that in the state shown in FIG. 3(*a*), i.e., S1>S0. As a result, greater electrostatic capacitance is achieved in the state shown in FIG. 3(*b*) compared to that achieved in the state shown in FIG. 3(*a*).

As a result, as the movable substrate 12 in the state illustrated in FIG. 3(*a*) moves toward the fixed electrode, the negative charge moves from the GND side to the fixed electrode 11 and a current I flows through the load 14 along the direction indicated by the arrow in FIG. 3(*b*). As the movable substrate 12 in the state illustrated in FIG. 3(*b*) moves upward in the figure, on the other hand, the negative charge moves from the fixed electrode 11 toward the GND side resulting in a current I flowing through the load 14 along the direction indicated by the arrow in FIG. 3(*a*).

Assuming that the area of the electric double layer 16a in the state shown in FIG. 3(*a*) is 0.5 [$cm^2$] and the area of the electric double layer 16a in the state shown in FIG. 3(*b*) is 1 [$cm^2$], the electrostatic capacitance at the electric double layer 16a increases from 5 [$\mu F$] to 10 [$\mu F$]. This means that assuming that the potential difference at the electric double layer 16a is 1 V, an electric charge of 5 [$\mu C$] passes through the load 14. Further assuming that the shift from the state in FIG. 3(*a*) to the state in FIG. 3(*b*) occurs in 0.05 [sec]

(equivalent to a vibration at 20 Hz), 100 [µA] current flows through the load 14. As explained earlier, as the distance of the gap d is reduced from d0 to d1, the electric current flows from the fixed electrode 11 toward the GND side, whereas as the distance of the gap d increases from d1 to d0, the electric current flows from the GND side toward the fixed electrode 11. Namely, as the movable substrate 12 vibrates up/down due to a disturbance, an AC current flows through the load 14.

It is to be noted that while an explanation has been given in reference to FIGS. 2 and 3 on an example in which the power generated at the vibration energy harvester 1 is extracted as an electric current, the load may be otherwise connected so as to allow the power to be extracted as a voltage. In such a case, the electric power should be extracted as a voltage resulting from a change in the potential difference between the support substrate 121 and the fixed electrode 11, which occurs as the movable substrate 12 vibrates while the vibration energy harvester 1 is sustained in an open circuit state.

For instance, the distance (hereafter referred to as the electrode distance) between the fixed electrode 11 and the electret 122 may change from d0 to d1 and the contact area of the ion gel 13 and the movable substrate 12, i.e., the areas of the electric double layers 16a and 16b, may change from S0 to S1. In this situation, $Q=CVe$ and $C=\varepsilon \cdot S/de$ are true with C representing the electrostatic capacitance at both electric double layers 16a and 16b, Ve representing the potential difference manifesting at the electric double layers 16a and 16b, S representing the area of the electric double layers 16a and 16b, de representing the thickness of the electric double layers 16a and 16b and Q representing the amount of charge at the fixed electrode 11. While the two equations can be combined and modified into an equation $S \cdot Ve=Q \cdot de/\varepsilon$, a relationship written as $S0 \cdot Ve0=S1 \cdot Ve1$ is achieved by the potential difference Ve0 corresponding to the electrode distance d0 and the potential difference Ve1 corresponding to the electrode distance d1, since Q and the thickness de of the electric double layers remain unchanged. In other words, the potential difference Ve1 manifesting at the electric double layers 16a and 16b when the electrode distance is d1 changes as expressed in the following equation; $Ve1=(S0/S1) \cdot Ve0$.

In the conventional vibration energy harvester that generates power through a change in the electrostatic capacitance between the electrodes, assuming that the capacitor with 1 [cm$^2$] area and the distance with 1 [mm], as described earlier, when the distance changes from 1 [mm] to 0.5 [mm], the electrostatic capacitance increases to a value twice $8.85 \times 10^{-13}$ [F], resulting in a change $\Delta C$ in the electrostatic capacitance, which is expressed as; $\Delta C=8.85 \times 10^{-13}$ [F]. For instance, the change that would occur in the amount of charge at the electrode in conjunction with an electret with a voltage of 200 V applied thereto would be calculated as $1.77 \times 10^{-10}$ [C]=$1.77 \times 10^{-4}$ [µC]. This value amounts to approximately 1/10,000 of 5 [µC] achieved in the present embodiment (assuming that the potential difference manifesting at the electric double layer 16a is 1 V).

The vibration energy harvester achieved in the present embodiment described above, by using the electrostatic capacitance at the electric double layers formed with the ion gel, is capable of generating power in a quantity exponentially greater than that of the conventional one. The electrostatic capacitance at an electric double layer is much greater than the electrostatic capacitance generated at an ordinary capacitor. Due to this, a large quantity of electric power can be obtained through a small displacement in a vibration energy harvester provided as a compact unit. In addition, since the area of the electric double layers is altered through a change in the distance between the movable substrate 12 and the fixed electrode 11 resulting from a disturbance, a significant change in the areal size is achieved in correspondence to a small displacement, which makes it possible to further miniaturize the vibration energy harvester 1.

A conventional vibration energy harvester such as the vibration energy harvester disclosed in PTL1, normally adopts a structure that includes a movable member with a relatively large mass, which is movably supported via an elastic supporting member having an extremely small spring constant. The rationale for this structural design is that the vibration energy harvester generates power with external vibrations such as walking vibrations, bridge vibrations or the like, the frequencies of which fall into a range of several Hz to several tens of Hz. Namely, the structure with the movable member supported by an elastic supporting member having a very small spring constant is adopted so as to allow resonance at such low frequencies. This structural design, adopted in the conventional vibration energy harvester, gives rise to a problem in that the elastic supporting member tends to break readily. There is also an issue that the conventional vibration energy harvester, which generates power through resonance, can only be used over a narrow frequency band.

Under such circumstances, a structure in which the movable substrate 12 is allowed to vibrate freely by adopting a sliding structure such as that illustrated in FIG. 1, is assumed in the present embodiment. Since the stiffness of the ion gel can be adjusted easily, efficient power generation can be assured even when the frequency of the external vibration is low by, for instance, using a very soft ion gel. In addition to the ion gel stiffness adjustment for better power generation efficiency, a hollow structure may be assumed in the ion gel so that it is allowed to alter its shape readily. Such a structure enables efficient power generation regardless of the frequency of the external vibration since it does not require resonance. It is obvious, however, that the vibration energy harvester in the present embodiment may also adopt a structure in which the movable substrate 12 is supported via an elastic supporting member.

It is to be noted that while the container assumes a cylindrical shape and the fixed electrode 11 and the movable substrate 12 both take on a disk shape in the present embodiment described above, the present invention may be adopted in conjunction with members having shapes other than these. For instance, the fixed electrode 11 and the movable substrate 12 may be rectangular members. In addition, while the movable substrate 12 moves up/down through a sliding motion, the present invention may instead be adopted in conjunction with a structure in which the electrode vibrates. As a further alternative, the fixed electrode 11 and the movable substrate 12 may both be allowed to move.

While the load 14 is directly connected to the fixed electrode 11 in FIG. 2 illustrating the operational principle, an electricity generating device may instead be configured by disposing a rectifier circuit, a power storage unit and the like on the output side of the vibration energy harvester 1.

—Second Embodiment—

Figure 4:
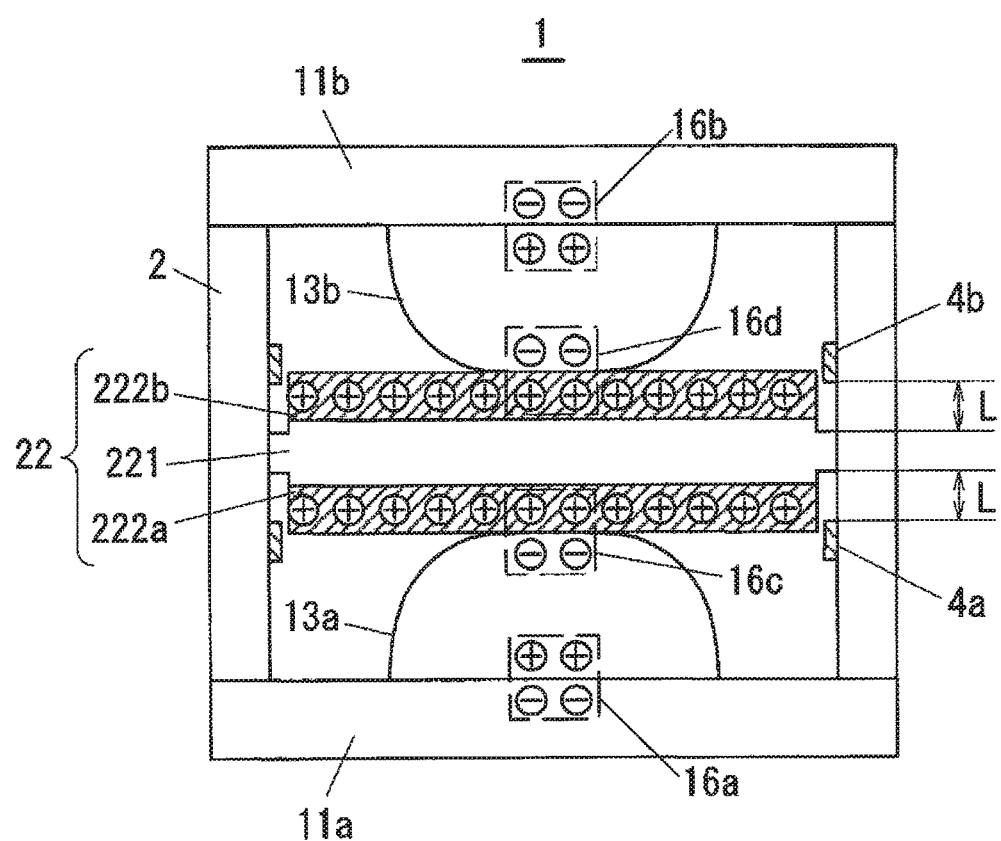
FIG. 4 shows a schematic illustration of the structure adopted in the vibration energy harvester achieved in a second embodiment
Figure 5:
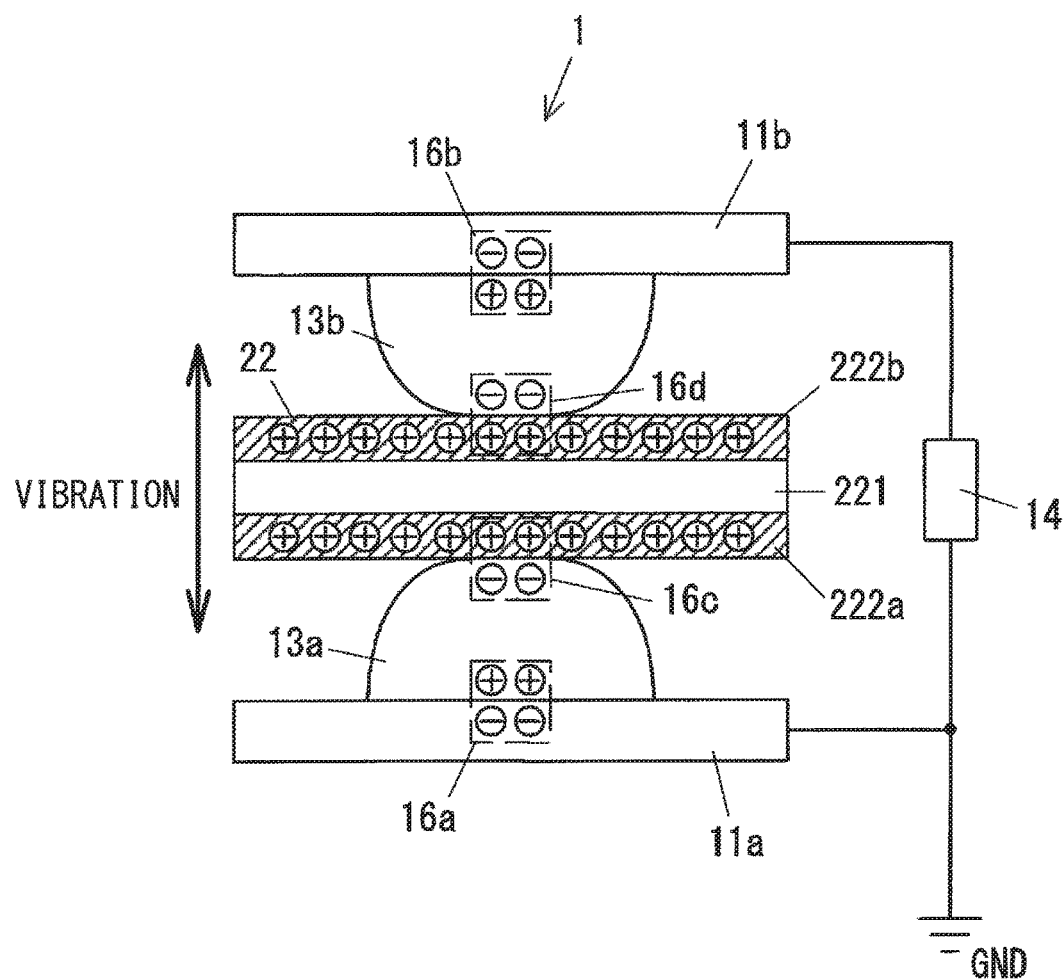
FIG. 5 shows a schematic illustration of an essential part of the vibration energy harvester shown in FIG. 4
Figure 6:
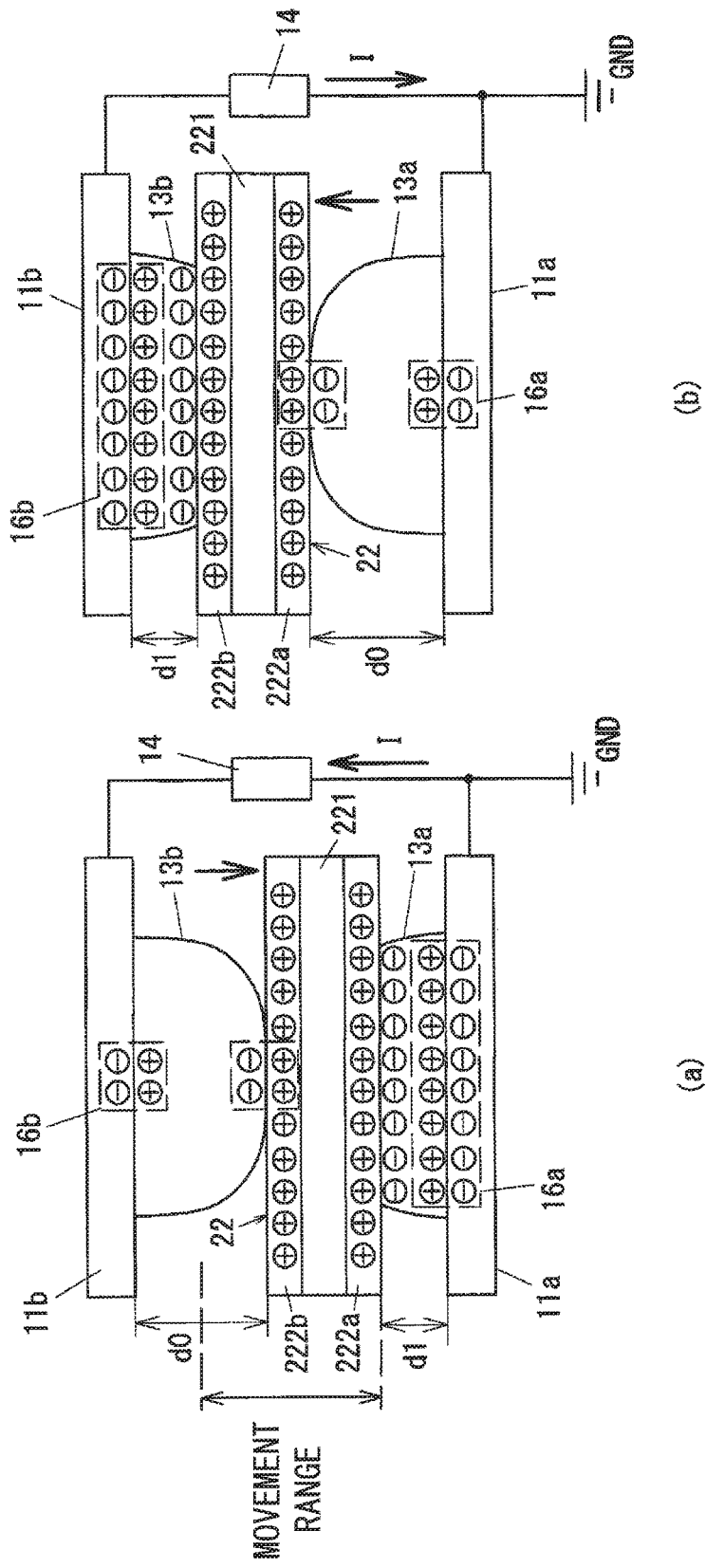
FIG. 6 shows illustrations of the power generating operation executed in the second embodiment

FIGS. 4 through 6 illustrate the second embodiment of the present invention. FIG. 4 schematically illustrates the structure of a vibration energy harvester 1 in a sectional view similar to that presented in FIG. 1(a). It is to be noted that the following explanation focuses on features distinguishing the structure shown in FIG. 1.

A movable substrate 22 in this embodiment includes electrets 222a and 222b formed respectively at the front surface and at the back surface of a support substrate 221. A first fixed electrode 11a is provided so as to face opposite the electret 222a, and a second fixed electrode 11b is provided so as to face opposite the electret 222b. An ion gel 13a is present in the gap between the electret 222a and the fixed electrode 11a, and an ion gel 13b is present in the gap between the electret 222b and the fixed electrode 11b.

The movable substrate 22 is provided so as to be allowed to move along the up/down direction between the fixed electrodes 11a and 11b in the figure and its range of movement 2L is limited by stoppers 4a and 4b. It is to be noted that since the movement range of the movable substrate 22 can be regulated with the elasticity of the ion gels 13a and 13b as in the first embodiment, the stoppers 4a and 4b do not need to be provided. In the example presented in FIG. 4, the movable substrate 22 is located at the central position within its movement range. A cylindrical portion 2, the fixed electrode 11a mounted at the lower opening of the cylindrical portion 2 and the fixed electrode 11b mounted at the upper opening of the cylindrical portion 2 configure a container. As in the first embodiment, the inside of the container is kept in a vacuum state.

FIG. 5 schematically illustrates an essential part of the vibration energy harvester 1. In FIG. 5, showing a load connection structure adopted for electric current extraction, a load 14 is connected between the fixed electrode 11a and the fixed electrode 11b, with the fixed electrode 11a assuming the GND potential. The electrets 222a and 222b are positively charged. Thus, electric double layers similar to those in the first embodiment are formed, one at the interface of the ion gel 13a and the fixed electrode 11a, and one at the interface of the ion gel 13b and the electret 222b. In the figure, reference sign 16a indicates the electric double layer formed between the ion gel 13a and the fixed electrode 11a and reference sign 16b indicates the electric double layer formed between the ion gel 13b and the fixed electrode 11b. In addition, reference signs 16c and 16d respectively indicate the electric double layer formed at the interface of the ion gel 13a and the electret 222a and the electric double layer formed at the interface of the ion gel 13b and the electret 222b.

FIG. 6 illustrates how electric current flows through the load 14 when the movable substrate 22 vibrates. FIG. 6(a) shows the movable substrate 22 having moved to the lower end of its movement range. Settings are selected so that the distance between the electret 222a and the fixed electrode 11a is d1 and the distance between the electret 222b and the fixed electrode 11b is d0 in this state. In addition, settings are selected so that the electric double layer 16a formed at the contact surface of the fixed electrode 11a and the ion gel 13a takes up an area S0 in correspondence to the contact area over which the electret 222a and the ion gel 13a contact each other and that the electric double layer 16b formed at the contact surface of the fixed electrode 11b and the ion gel 13b takes up an area S1 in correspondence to the contact area over which the electret 222b and the ion gel 13b contact each other. FIG. 6(b) shows the movable substrate 22 having moved to the upper end of its movement range. In this state, the distance between the electret 222a and the fixed electrode 11a is d0 and the distance between the movable electrode 11b and the electret 222b is d1. In addition, the electric double layer 16a takes up the area S1 and the electric double layer 16b takes up the area S0.

In this example, as the movable substrate 22 in the state shown in FIG. 6(a) moves toward the fixed electrode 11b thereby entering the state shown in FIG. 6(b), the electrostatic capacitance at the electric double layer 16a decreases and the electrostatic capacitance at the electric double layer 16b increases. As a result, a negative charge moves from the fixed electrode 11a to the fixed electrode 11b, resulting in a current I flowing through the load 14 along the direction indicated by the arrow in FIG. 6(b).

In contrast, as the movable substrate 22 in the state shown in FIG. 6(b) moves toward the fixed electrode 11a thereby entering the state shown in FIG. 6(a), the electrostatic capacitance at the electric double layer 16a increases and the electrostatic capacitance at the electric double layer 16b decreases. As a result, a negative charge moves from the fixed electrode 11b to the fixed electrode 11a, resulting in a current I flowing through the load 14 along the direction indicated by the arrow in FIG. 6(a).

In an open circuit state, the relationship between the potential difference between the movable substrate 22 and the fixed electrode 11a and the potential difference between the movable substrate 22 and the fixed electrode 11b is similar to that between the movable substrate 12 and the fixed electrode 11 described in reference to FIG. 2. However, since the phases of the individual potentials are offset by 180° relative to each other, the potential difference manifesting between the fixed electrode 11a and the fixed electrode 11b will be twice that manifesting in the structure shown in FIG. 3.

Thus, double in power (electric power) that generated in the first embodiment shown in FIG. 1 is obtained through the power generation achieved in the present embodiment.

It is to be noted that while the electric power generated in the present embodiment is also output as an electric current, it may instead be extracted as a voltage. Since the operation executed in such a case will be similar to that described in reference to the first embodiment, a repeated explanation is not provided. In addition, while the container assumes a cylindrical shape and the fixed electrodes 11a and 11b and the movable substrate 22 each take on a disk shape in the embodiment described above, the present invention may be adopted in conjunction with members having shapes other than these. Furthermore, while the movable substrate 22 moves up/down through a sliding motion, the present invention may instead be adopted in conjunction with a structure in which the movable substrate 22 is supported via, for instance, an elastic member.

Figure 8:
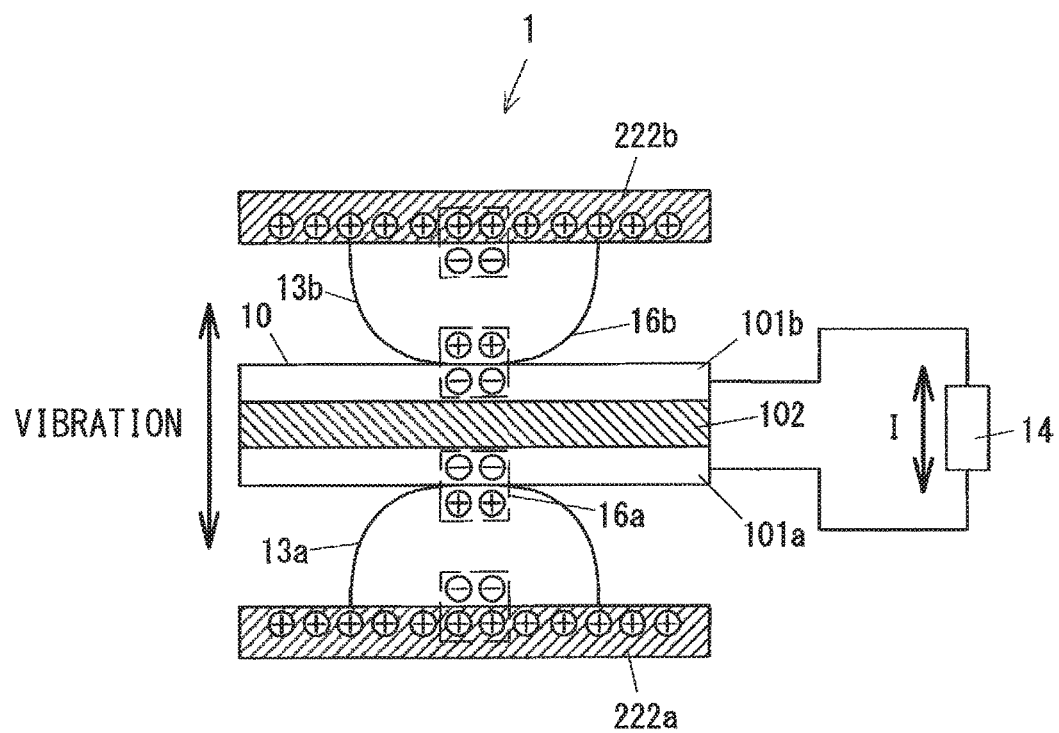
FIG. 8 shows an illustration of a structure that allows vibration to occur on the electrode side in the second embodiment

In addition, the present invention may be adopted in a structure such as that shown in FIG. 8, in which the electrode side, instead of the electret side, vibrates. In the example presented in FIG. 10, a movable electrode 10 is provided so as to be allowed to move up/down between a pair of electrets 222a and 222b that function as fixed electrodes. The electrets 222a and 222b are formed so that their surfaces that face opposite the movable electrode 10 are charged. The movable electrode 10 assumes a structure that includes an insulating substrate 102 held between electrodes 101a and 101b constituted of gold or the like. The electrode 101a faces opposite the electret 222a, whereas the electrode 101b faces opposite the electret 222b.

A load 14 is connected between the electrode 101a and the electrode 101b. As the movable electrode 10 moves toward, for instance, the electret 222a, the contact area of the electrode 101a and an ion gel 13a increases and the contact area of the electrode 101b and an ion gel 13b decreases. As a result, a negative charge moves via the load 14 from the electrode 101b to the electrode 101a and consequently, an electric current I flows through the load 14 along the upward direction in the figure. On the other hand, the movable electrode 10 moves toward the electret 222b, a negative charge moves from the electrode 101a to the electrode 101b, resulting in an electric current flowing through the load 14 along the downward direction in the figure.

—Third Embodiment—

Figure 7:
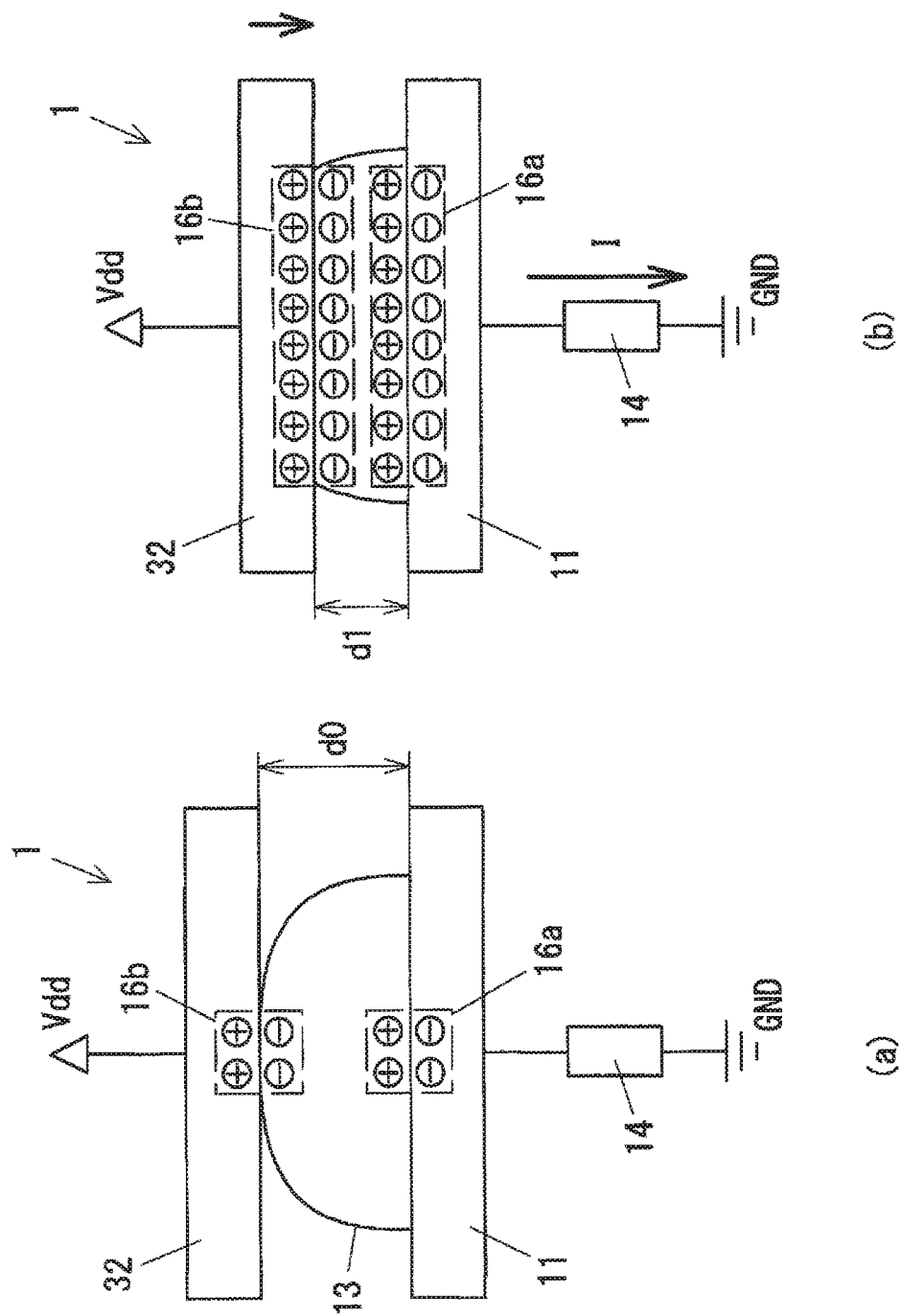
FIG. 7 shows illustrations of a third embodiment

FIG. 7 schematically illustrates an essential part of the vibration energy harvester 1 achieved in the third embodiment of the present invention. In the first embodiment described earlier, the electric double layer 16a is formed at the region where the ion gel 13 and the fixed electrode 11 are in contact with each other by using the electret 122, as shown in FIG. 2. In the present embodiment, a movable electrode 32 with a bias voltage Vdd applied thereto from an external source is used in place of the movable substrate 12 with the electret 122 formed thereat.

As the bias voltage Vdd is applied to the movable electrode 32, negative ions in an ion gel 13 are attracted toward the movable electrode and positive ions in the ion gel 13 are attracted toward a fixed electrode, as illustrated in FIG. 7(a). As a result, electric double layers 16a and 16b are formed at the interface of the fixed electrode 11 and the ion gel 13 and at the interface of the movable electrode 32 and the ion gel 13. Assuming that the bias voltage Vdd is equal to the voltage (surface potential) at the electret 122 in the first embodiment, the electric double layers 16a and 16b thus formed will be similar to those in FIG. 2. As the distance between the fixed electrode 11 and the movable electrode 32 is reduced to d1, the areas of the electric double layers 16a and 16b increase, as shown in FIG. 7(b), resulting in an increase the electrostatic capacitance thereat, as has been explained in reference to the first embodiment.

In addition, instead of moving an electrode with a power source connected thereto up/down, an electrode with a load connected thereto may be caused to move up/down. Furthermore, a structure in which both electrodes are made to move up/down as the distance between them changes may be adopted. It is known that the formation of an electric double layer at the interface of a metal electrode and an ion gel is attributed to an electrokinetic phenomenon. For instance, an electrokinetic potential of approximately several tens of [mV] is generated if a metal electrode constituted of, for example, gold. Although the voltage is bound to be lower than that achieved in conjunction with the electret and the external power source, as explained earlier, an electric double layer corresponding to the voltage is formed at the interface of the metal electrode and the ion gel. Consequently, a vibration energy harvester similar to that described in reference to the embodiment can be configured by using an electrokinetic potential.

—Fourth Embodiment—

FIG. 9 illustrates the fourth embodiment of the present invention in schematic diagrams of an essential part of a vibration energy harvester 1. The structure achieved in the third embodiment includes the movable electrode 32 with the bias electrode Vdd applied thereto from an external source, as has been explained in reference to FIG. 7. In the present embodiment, a structure that includes a movable electrode 42 without any bias voltage applied thereto is adopted in conjunction with an ion gel 13c having anions and cations fixed therein.

As shown in FIG. 9, a layer constituted of anions (an anion layer) holding a negative charge is formed and sustained on the upper surface side of the ion gel 13c, which comes in contact with the movable electrode 42. On the lower surface side, which comes in contact with the fixed electrode 11, a layer constituted of cations (a cation layer) holding a positive charge is formed and sustained. The anion layer and the cation layer are sustained at the ion gel 13c even in a steady state with no voltage applied thereto.

It is to be noted that as the ion gel 13c with anions and cations fixed therein as described above, various type of materials may be used. For instance, an unsaturated bond may be introduced into cations or anions constituting a specific type of ionic liquid so as to form a polymer compound through polymerization of the ionic liquid containing the unsaturated bond. There are various such polymer compounds known, which may otherwise be referred to as ionic liquids with unsaturated bonds, poly-ion liquid, polymerized ionic liquid or the like. During the formation of such a polymer compound, it is cured by applying a predetermined voltage in conjunction with a transparent electrode such as an IT0. Through this method, the ionic liquid can be gelled by forming and sustaining an anion layer on the side having been in contact with the positive electrode and forming and sustaining a cation layer on the side having been in contact with the negative electrode even after the voltage applied stops. This gelled ionic liquid can be used as the ion gel 13c. Alternatively, a polymer having an unsaturated bond and an ionic liquid may be used to form the ion gel 13c by using the ionic liquid while forming and sustaining an anion layer and a cation layer through a process similar to that described above. In this case, as long as anions and cations can be fixed through a polymerization reaction for forming the polymer, any ionic liquid may be used. As a further alternative, the ion gel 13c having an anion layer and a cation layer formed and sustained thereat may be formed by using an ionic liquid being in a solid state in an operating environment in which the vibration energy harvester 1 can be engaged in operation. In more specific terms, while a predetermined voltage is applied to an ionic liquid with a melting point higher than the operating temperature of the vibration energy harvester 1, the ionic liquid should be solidified by cooling, initially at a temperature equal to or higher than the melting point to a temperature equal to or lower than the melting point. Through this method, too, anions and cations can be fixed and thus the ion gel 13c with an anion layer and a cation layer formed and sustained thereat can be prepared. In this situation, the ion gel 13c may be formed by using a material constituted with an ionic liquid which has been fixed by being in a solid state within a polymer. The present invention is not limited to these examples and any substance may be used as the ion gel 13c as long as it is prepared by using an ionic liquid in a state in which anions and cations are fixed.

As the ion gel 13c contacts the movable electrode 42 and the fixed electrode 11, a positive charge is attracted toward the anion layer of the ion gel 13c on the side where the movable electrode 42 is present and a negative charge is attracted toward the cation layer of the ion gel 13c on the side where the fixed electrode 11 is present, as shown in FIG. 9(a). As a result, electric double layers 16a and 16b are formed at the interface of the fixed electrode 11 and the ion gel 13c and at the interface of the movable electrode 42 and the ion gel 13c. Assuming that the potential difference between the fixed electrode 11 and the movable electrode 42 is equal to the bias voltage Vdd in the third embodiment, electric double layers 16a and 16b similar to those in FIG. 7(a) will be formed. As the distance between the fixed electrode 11 and the movable electrode 42 is reduced to d1, the area of the electric double layers 16a and 16b increases as shown in FIG. 9(b), resulting in an increase in the electrostatic capacitance thereat, as has been explained in reference to the third embodiment.

Thus, as the movable electrode 42 in the state shown in FIG. 9(a) moves toward the fixed electrode 11, the positive charge moves via the load 14 toward the movable electrode 42 from the fixed electrode 11 and the negative charge moves via the load 14 to the fixed electrode 11 from the movable electrode 42. As a result, an electric current I flows through the load 14, as indicated by the arrow in FIG. 9(b). In contrast, as the movable electrode 42 in the state shown in FIG. 9(b) moves upward in the figure, the positive charge moves via the load 14 toward the fixed electrode 11 from the movable electrode 42 and the negative charge moves via the load 14 toward the movable electrode 42 from the fixed electrode 11. As a result, an electric current I flows through the load 14, as indicated by the arrow in FIG. 9(a).

In the vibration energy harvester achieved in the present embodiment described above, the ion gel 13c having anions and cations fixed therein is used and thus, an anion layer can be formed and sustained on the side where the movable electrode 42 is present and a cation layer can be formed and sustained on the side where the fixed electrode 11 is present. Consequently, electric double layers can be formed between the ion gel 13c and the movable electrode 42 and between the ion gel 13c and the fixed electrode 11 without having to use an electret, as in the first and second embodiments, or without having to use an electrode with a bias voltage applied thereto, as in the third embodiment.

It is to be noted that the positional arrangement in FIG. 9 may be reversed and that a cation layer may be formed and sustained on the side where the movable electrode 42 is present and an anion layer may be formed and sustained on the side where the fixed electrode 11 is present. In addition, an electric current I can be caused to flow through the load 14 as the movable electrode 42 moves, as has been explained in reference to FIG. 9, even when an anion layer or a cation layer is formed and sustained only on the side that comes into contact with either the movable electrode 42 or the fixed electrode 11. Namely, the vibration energy harvester in the present embodiment simply requires an anion layer or a cation layer formed and sustained at least on one side coming into contact with either of the pair of electrodes, i.e., the movable electrode 42 and the fixed electrode 11, provided so as to face opposite each other. This means that at least either anions or cations need to be fixed to the ion gel 13c. Moreover, a structure in which the two electrodes are made to move up/down as the distance between them changes may be adopted.

As has been explained, as shown in FIGS. 1 and 2, the vibration energy harvester according to the present invention includes a fixed electrode 11 and a movable substrate 12 provided so as to face opposite each other, constituting a pair of electrodes at least one of which is allowed to move, and an ion gel 13 provided between these electrodes, which is formed by using an ionic liquid.

As the movable substrate 12 is caused to move by a disturbance, the area of an electric double layer 16a formed on the two sides of the interface of the fixed electrode 11 and the ion gel 13 and the area of an electric double layer 16b formed on the two sides of the interface of an electret 122 at the movable substrate 12 and the ion gel 13 change as shown in FIG. 3. As a result, a change occurs in the electrostatic capacitance at the electric double layer 16a, inducing an electric current to flow through a load 14 connected to the fixed electrode 11.

The thicknesses of the electric double layers are in an nm order, are exponentially smaller in comparison to the distance between electrodes in a conventional vibration energy harvester, and thus, the extent of change occurring in the electrostatic capacitance as the movable substrate 12 vibrates, exponentially increases. Consequently, advantages are achieved in that power can be generated in a much greater quantity compared to that achieved in the conventional vibration energy harvester and that further miniaturization of the vibration energy harvester is facilitated. In addition, since the area of the electric double layers are altered by changing the distance between the fixed electrode 11 and the electret 122, a significant change in the areal size can be achieved by displacing the movable substrate 12 only slightly.

It is to be noted that since the surface potential at the electret 122 is set so that the voltages at the electric double layers 16a and 16b fall within the range defined by the potential window of the ion gel 13 when the iron gel 13 comes in contact with the electret 122, the electric double layers 16a and 16b can be formed in a stable manner without any electric current flowing through the ion gel 13.

It is to be also noted that the electric double layers 16a and 16b may be formed by using the electret 122 as described above, through the electrokinetic phenomenon or by applying a bias voltage to a movable electrode via a voltage source, as shown in FIG. 7. The bias voltage should be set within the range of the potential window mentioned earlier. In addition, an ion gel 13c with at least either anions or cations fixed therein as shown in FIG. 9 may be used so as to form an electric double layer in the region where at least one of the electrodes comes into contact with an anion layer or a cation layer at the ion gel 13c.

As an alternative, a structure that includes a movable substrate 22 with an electret 222b used as a front-side electrode and an electret 222a used as a back-side electrode respectively formed at the front surface and at the back surface thereof, a fixed electrode 11b provided so as to face opposite the electret 222b and a fixed electrode 11a provided so as to face opposite the electret 222a, as shown in FIG. 4, may be adopted. In this alternative structure, an ion gel 13b is provided between the fixed electrode 11b and the electret 222b and an ion gel 13a is provided between the fixed electrode 11a and the electret 222a. Consequently, a change in the voltage occurs between the fixed electrode 11a and the fixed electrode 11b to an extent that is twice the extent of the change achieved in conjunction with a single fixed electrode 11 in the structure shown in FIG. 2.

The individual embodiments described above may each be adopted by itself or in any combination thereof so as to achieve the advantages of a given embodiment or to achieve all the advantages of the combined embodiments in a synergistic manner. In addition, as long as features characterizing the present invention remain intact, the present invention is in no way limited to the particulars of the specific embodiments. It is to be noted that while the present invention is embodied as a vibration energy harvester, as has been described above, capacitors achieving a large capacity through the formation of electric double layers in conjunction with an ion gel, as disclosed in this document, may be used in applications as large-capacity power storage elements. Such a power storage element may be used in order to store a charge generated through an external vibration for preparing the case electric power is necessary. Since a power storage element can be configured by using materials similar to those used to configure a generator element and adopting a similar structure, a device capable of functioning both as a power generator and a storage element can be manufactured with ease.

The disclosure of the following priority application is herein incorporated by reference:
Japanese Patent Application No. 2015-6690 filed Jan. 16, 2015.

REFERENCE SIGNS LIST

1 . . . vibration energy harvester, 4a, 4b . . . stopper, 10, 32, 42 . . . movable electrode, 11, 11a, 11b . . . fixed electrode, 12, 22 . . . movable substrate, 13, 13a, 13b, 13c . . . ion gel, 14 . . . load, 16a to 16d . . . electric double layer, 121, 221 . . . support substrate, 122, 222a, 222b . . . electret

The invention claimed is:

1. A vibration energy harvester, comprising:
a pair of electrodes provided so as to face opposite each other, with at least one of the pair of electrodes being a movable electrode;
a pair of ring-shaped stoppers defining a range of up/down movement of the movable electrode; and
an ion gel provided between the pair of electrodes, which is formed by using an ionic liquid, wherein:
as an external vibration causes the movable electrode to move along a direction in which a distance between the pair of electrodes changes, power is generated through a change in an area of an electric double layer formed on two sides of an interface of each electrode and the ion gel.

2. The vibration energy harvester according to claim 1, wherein:
one of the pair of electrodes facing opposite each other is an electret electrode; and
a surface potential at the electret electrode is set so that when the ion gel comes in contact with the electret electrode, a voltage at the electric double layer is within a range defined by the ion gel.

3. The vibration energy harvester according to claim 2, wherein:
the pair of electrodes are a fixed electrode and the movable electrode that is allowed to move along a direction in which a distance thereof from the fixed electrode changes,
the movable electrode includes a front-side electrode provided on a front surface side of the movable electrode and a back-side electrode provided on a back surface side of the movable electrode;
the fixed electrode includes a first electrode provided so as to face opposite the front-side electrode and a second electrode provided so as to face opposite the back-side electrode; and
the ion gel is provided between the first electrode and the front-side electrode and between the second electrode and the back-side electrode.

4. The vibration energy harvester according to claim 1, wherein:
the electric double layer is formed through an electrokinetic phenomenon occurring over a contact region where each of the pair of electrodes and the ion gel are in contact with each other.

5. The vibration energy harvester according to claim 4, wherein:
the pair of electrodes are a fixed electrode and the movable electrode that is allowed to move along a direction in which a distance thereof from the fixed electrode changes,
the movable electrode includes a front-side electrode provided on a front surface side of the movable electrode and a back-side electrode provided on a back surface side of the movable electrode;
the fixed electrode includes a first electrode provided so as to face opposite the front-side electrode and a second electrode provided so as to face opposite the back-side electrode; and
the ion gel is provided between the first electrode and the front-side electrode and between the second electrode and the back-side electrode.

6. The vibration energy harvester according to claim 1, wherein:
the ion gel is formed by using the ionic liquid, which contains an unsaturated bond.

7. The vibration energy harvester according to claim 6, wherein:
an anion layer or a cation layer is formed and sustained on a side of the ion gel that comes into contact with at least one of the pair of electrodes; and
the electric double layer is formed in a contact region where at least one of the pair of electrodes comes into contact with the anion layer or the cation layer in the ion gel.

8. The vibration energy harvester according to claim 7, wherein:
the pair of electrodes are a fixed electrode and the movable electrode that is allowed to move along a direction in which a distance thereof from the fixed electrode changes,
the movable electrode includes a front-side electrode provided on a front surface side of the movable electrode and a back-side electrode provided on a back surface side of the movable electrode;
the fixed electrode includes a first electrode provided so as to face opposite the front-side electrode and a second electrode provided so as to face opposite the back-side electrode; and
the ion gel is provided between the first electrode and the front-side electrode and between the second electrode and the back-side electrode.

9. The vibration energy harvester according to claim 6, wherein:
the pair of electrodes are a fixed electrode and the movable electrode that is allowed to move along a direction in which a distance thereof from the fixed electrode changes,
the movable electrode includes a front-side electrode provided on a front surface side of the movable electrode and a back-side electrode provided on a back surface side of the movable electrode;
the fixed electrode includes a first electrode provided so as to face opposite the front-side electrode and a second electrode provided so as to face opposite the back-side electrode; and
the ion gel is provided between the first electrode and the front-side electrode and between the second electrode and the back-side electrode.

10. The vibration energy harvester according to claim 1, wherein:
the ion gel is formed by using a polymer containing an unsaturated bond and the ionic liquid.

11. The vibration energy harvester according to claim 10, wherein:
an anion layer or a cation layer is formed and sustained on a side of the ion gel that comes into contact with at least one of the pair of electrodes; and the electric double layer is formed in a contact region where at least one of the pair of electrodes comes into contact with the anion layer or the cation layer in the ion gel.

12. The vibration energy harvester according to claim 11, wherein:
   the pair of electrodes are a fixed electrode and the movable electrode that is allowed to move along a direction in which a distance thereof from the fixed electrode changes,
   the movable electrode includes a front-side electrode provided on a front surface side of the movable electrode and a back-side electrode provided on a back surface side of the movable electrode;
   the fixed electrode includes a first electrode provided so as to face opposite the front-side electrode and a second electrode provided so as to face opposite the back-side electrode; and
   the ion gel is provided between the first electrode and the front-side electrode and between the second electrode and the back-side electrode.

13. The vibration energy harvester according to claim 10, wherein:
   the pair of electrodes are a fixed electrode and the movable electrode that is allowed to move along a direction in which a distance thereof from the fixed electrode changes,
   the movable electrode includes a front-side electrode provided on a front surface side of the movable electrode and a back-side electrode provided on a back surface side of the movable electrode;
   the fixed electrode includes a first electrode provided so as to face opposite the front-side electrode and a second electrode provided so as to face opposite the back-side electrode; and
   the ion gel is provided between the first electrode and the front-side electrode and between the second electrode and the back-side electrode.

14. The vibration energy harvester according to claim 1, wherein:
   the ion gel is formed by using the ionic liquid which has been made to a solid state.

15. The vibration energy harvester according to claim 14, wherein:
   an anion layer or a cation layer is formed and sustained on a side of the ion gel that comes into contact with at least one of the pair of electrodes; and
   the electric double layer is formed in a contact region where at least one of the pair of electrodes comes into contact with the anion layer or the cation layer in the ion gel.

16. The vibration energy harvester according to claim 15, wherein:
   the pair of electrodes are a fixed electrode and the movable electrode that is allowed to move along a direction in which a distance thereof from the fixed electrode changes,
   the movable electrode includes a front-side electrode provided on a front surface side of the movable electrode and a back-side electrode provided on a back surface side of the movable electrode;
   the fixed electrode includes a first electrode provided so as to face opposite the front-side electrode and a second electrode provided so as to face opposite the back-side electrode; and
   the ion gel is provided between the first electrode and the front-side electrode and between the second electrode and the back-side electrode.

17. The vibration energy harvester according to claim 14, wherein:
   the pair of electrodes are a fixed electrode and the movable electrode that is allowed to move along a direction in which a distance thereof from the fixed electrode changes,
   the movable electrode includes a front-side electrode provided on a front surface side of the movable electrode and a back-side electrode provided on a back surface side of the movable electrode;
   the fixed electrode includes a first electrode provided so as to face opposite the front-side electrode and a second electrode provided so as to face opposite the back-side electrode; and
   the ion gel is provided between the first electrode and the front-side electrode and between the second electrode and the back-side electrode.

18. The vibration energy harvester according to claim 1, wherein:
   the pair of electrodes are a fixed electrode and the movable electrode that is allowed to move along a direction in which a distance thereof from the fixed electrode changes,
   the movable electrode includes a front-side electrode provided on a front surface side of the movable electrode and a back-side electrode provided on a back surface side of the movable electrode;
   the fixed electrode includes a first electrode provided so as to face opposite the front-side electrode and a second electrode provided so as to face opposite the back-side electrode; and
   the ion gel is provided between the first electrode and the front-side electrode and between the second electrode and the back-side electrode.

* * * * *